United States Patent [19]

Davis, Jr. et al.

[11] Patent Number: 5,323,105
[45] Date of Patent: Jun. 21, 1994

[54] TEST TEMPLATE FOR MONITORING THE PINS OF A MULTI-PIN CHIP CIRUCIT PACKAGE

[75] Inventors: Thomas L. Davis, Jr., Hyde Park; Terrence A. Quinn, Poughkeepsie, both of N.Y.

[73] Assignee: International Business Machines Corporation, Armonk, N.Y.

[21] Appl. No.: 742,777

[22] Filed: Aug. 8, 1991

[51] Int. Cl.$^5$ .................... G01R 31/02; H01R 23/72
[52] U.S. Cl. ................ 324/158 F; 324/73.1; 439/68
[58] Field of Search ........... 324/158 F, 158 P, 72.5; 439/482, 842, 70, 68, 71, 72; 361/400, 401, 403, 412, 413, 414; 174/260, 52.4

[56] References Cited

U.S. PATENT DOCUMENTS

| | | | |
|---|---|---|---|
| 2,906,943 | 9/1959 | Garman | 324/73.1 |
| 4,700,276 | 10/1987 | Freyman et al. | 361/403 |
| 4,835,469 | 5/1989 | Jones et al. | 324/158 F |
| 4,853,626 | 8/1989 | Resler | 324/158 F |
| 4,860,165 | 8/1989 | Cassinelli | 361/414 |
| 4,862,076 | 8/1989 | Renner et al. | 324/158 F |
| 4,924,179 | 5/1990 | Sherman | 324/158 F |
| 4,928,061 | 5/1990 | Dampiere et al. | 324/158 |
| 4,964,737 | 10/1990 | Baker et al. | 374/179 |
| 4,998,250 | 3/1991 | Kahlmeier et al. | 371/15.1 |
| 5,001,422 | 3/1991 | Dahlberg et al. | 324/158 F |
| 5,055,780 | 10/1991 | Takagi et al. | 324/158 F |
| 5,065,284 | 11/1991 | Hernandez | 361/414 |

*Primary Examiner*—Vinh Nguyen

[57] ABSTRACT

A module probe template comprises a substrate of electrically insulative material which possesses contact pads or lands which at least partially surround substrate apertures which match the pin pattern on a module to be tested. Pin shoulders make contact with the land portions in the vicinity of the apertures and a second portion of the conductive land pattern extends to the edge of the template so as to provide connections to wires which supply signals to test and/or control instrumentation. A layer of thin electrically insulative tape or other material is also preferably laid over the conductive paths with small apertures present in the insulative tape so as to provide (in one embodiment) access to the contact land near the pin holes. This test template apparatus thus makes it possible to control and/or monitor pins which are otherwise inaccessible except with much greater difficulty.

6 Claims, 2 Drawing Sheets

TEST TEMPLATE FOR MONITORING THE PINS OF A MULTI-PIN CHIP CIRUCIT PACKAGE

BACKGROUND OF THE INVENTION

The present invention is generally directed to a test device for monitoring the electrical characteristics of electronic circuits via the circuit connection pins present on a multi-pin chip circuit package. More particularly, the present invention provides a mechanism for accessing both external and internally positioned pins under actual circuit operating conditions. Even more particularly, the present invention is directed to a method and apparatus for monitoring and testing circuit packages employed in large main frame computer systems. However, the present invention is not limited thereto.

In order to fully appreciate the present invention, it is desirable to possess a complete understanding of the context and systems in which such an invention is typically employed. In particular, in the manufacture of large main-frame computer systems, there is a need for the utilization of circuit packages referred to as thermal conduction modules (TCMs). These modules contain a multiplicity of closely packed integrated circuit chips. Because of the power requirements for these chips, which are designed to operate as quickly as possible, water cooling is provided. These modules, some having thousands of pins, are inserted into circuit boards. Clearly because of the number of pins and the pin spacing, pin alignment is an important aspect of the operation. However, once these modules are inserted into their corresponding circuit boards, typically referred to as TCM or Clark boards, access to the voltages present on the pins is very difficult. However, once all of the TCMs are arranged and configured in a machine, it is nonetheless often desirable to be able to test and determine voltages that appear on certain ones of the pins. Additionally, it may also be desirable to inject signals into various pins.

To facilitate probing of the TCM pins, in one design the TCMs are mounted on a swingable and supportable gate frame for access to the pins from the backside of the Clark board. However, design considerations for power requirements and the length of signal lines can limit the utility of frame rotating mechanisms. Additionally, it should be noted that frame rotation procedures for gaining access to the rear pin configurations of Clark boards and alike make access very difficult. It is noted though that this 'frame rotation' is not representative of customer shipped machine layout. Furthermore, it can be difficult to determine exactly which one of hundreds or thousands of pins one wishes to probe from the back of the board. Lastly, it should also be appreciated that the rotation of the frame mechanisms on which the TCMs are disposed is a time consuming operation requiring up to approximately seven hours to achieve because of the signal, power and cooling connections to the TCM and Clark board assembly.

Furthermore, it should be noted that the TCMs themselves possess many hundreds of pins which are relatively closely spaced and which must be carefully aligned. Accordingly, the TCMs themselves typically possess alignment structures and are typically disposed in recessed areas, all of which makes access to the pins themselves that much more difficult. Nevertheless during system test procedures, it is very desirable to be able to determine signal levels that appear on various pins. Oftentimes the signal which is desired to be monitored exists on a pin which lies within relatively inaccessible interior portions of the pin array which protrudes from the bottom of the TCM. Thus it becomes very desirable to be able to monitor pins for which it is very difficult to gain physical access.

SUMMARY OF THE INVENTION

In accordance with a preferred embodiment of the present invention, a test template for monitoring or controlling electrical signals appearing on the pins of a multi-pin chip circuit package is provided. The template comprises a flat, preferably flexible, insulative substrate with apertures which correspond to the pin configuration of the circuit package which is to be monitored or controlled. A pattern of flat conductive lands is disposed on the substrate. These lands include a first portion which is disposed in the vicinity of selected apertures. Each land also includes a second portion which is also referred to as a signal line or circuit line and which extends away from the aperture so as to pass between the circuit package's pins. An insulative layer is also preferably disposed over the conductive signal lines and the substrate. The insulative layer also possesses apertures which correspond to the pin patterns. However, the apertures in the insulative layer in the vicinity of pins which are to be monitored provide access to the first conductive land portions which, described above, are disposed in the vicinity of selected apertures. Wires are then attached to the second portion of the conductive lands, near the edge of the substrate. In an alternate embodiment of the present invention, printed circuit technology is employed to provide plated-through holes on the substrate with printed land patterns being disposed between the holes and the edges of the substrate. In this configuration, the template is employed in essentially a flipped over position with the land patterns being disposed on the side of the substrate which is furthest away from the circuit chip package. In this embodiment, the insulative layer is also disposed on the side of the substrate furthest from the chip package. It is also noted that the use of plated-through-hole (VIA) technology provides the capability of providing conductive land patterns for test purposes on both sides of the insulative substrate.

In order to facilitate contact between the circuit pins and the conductive portions of the template, the circuit package itself is preferably provided with pin shoulder portions which are positioned to make contact with the first portions of the land patterns surrounding an aperture. Accordingly, it is seen that the template of the present invention provides a method for electrically accessing otherwise concealed pins in a multi-pin circuit chip package without disconnecting the package from the circuit and without disruptive or expensive frame rotation procedures.

Accordingly, it is an object of the present invention to provide access for testing and other purposes to the pins of a multi-pin circuit chip package.

It is also an object of the present invention to measure and control signals associated with specified pins of a multi-pin circuit chip package, especially for test purposes.

It is yet another object of the present invention to obviate the need for performing frame rotation operations.

It is a still further object of the present invention to produce more reliable and more thoroughly tested electronic circuit components, especially for use in large main-frame computer systems.

It is also an object of the present invention to eliminate the need for "back of the board" probe techniques, methods and devices.

Lastly, but not limited hereto, it is an object of the present invention to selectively access electrical characteristics associated with specified circuit chip pins in a timely, efficient and most effective manner.

DESCRIPTION OF THE FIGURES

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
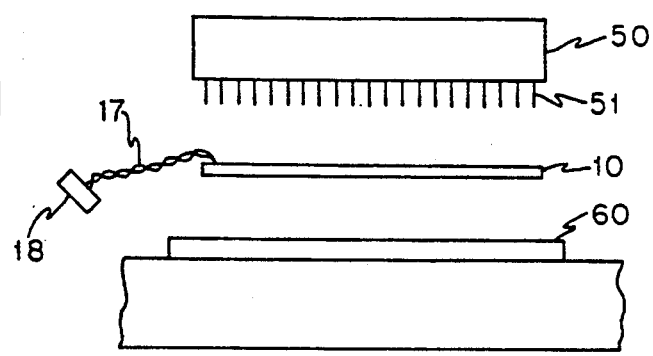
FIG. 1 is an exploded side elevation view illustrating the relationship between the template of the present invention, the multi-pin chip circuit package and the board into which it is inserted.

FIG. 1 illustrates the relative relationship between template 10, Clark board 60 and TCM or module 50 in an exploded view. In operation, pins 51 of TCM 50 are disposed through template 10 and thereafter subsequently inserted into corresponding contact openings in socket or Clark board 60. Module probe template 10 allows TCM pins 51 to be probed from the TCM side of Clark board 60 instead of through the use of a signal template and special probes applied to the back of Clark board 60. Module probe template 10 is therefore seen disposed beneath TCM 50 with TCM pins 51 extending therethrough into Clark board 60. This template allows testing of selected TCM pins to be done without the use of frame rotating hardware. It also allows testing to be done in the field where frame rotating hardware is not conveniently available. The template allows for consistent contact with the TCM pins and eliminates the necessity for hunting for good probe pin contacts on the backside of the Clark board.

The removable template of the present invention preferably consists of a pad of electrically insulative material (the substrate) slightly larger than the TCM footprint. The TCM's pin pattern is drilled into the pad of insulative material (the substrate). This pad or substrate is approximately the same thickness as the space between the TCM substrate and the Clark board (typically approximately 0.01 inches).

Figure 2:
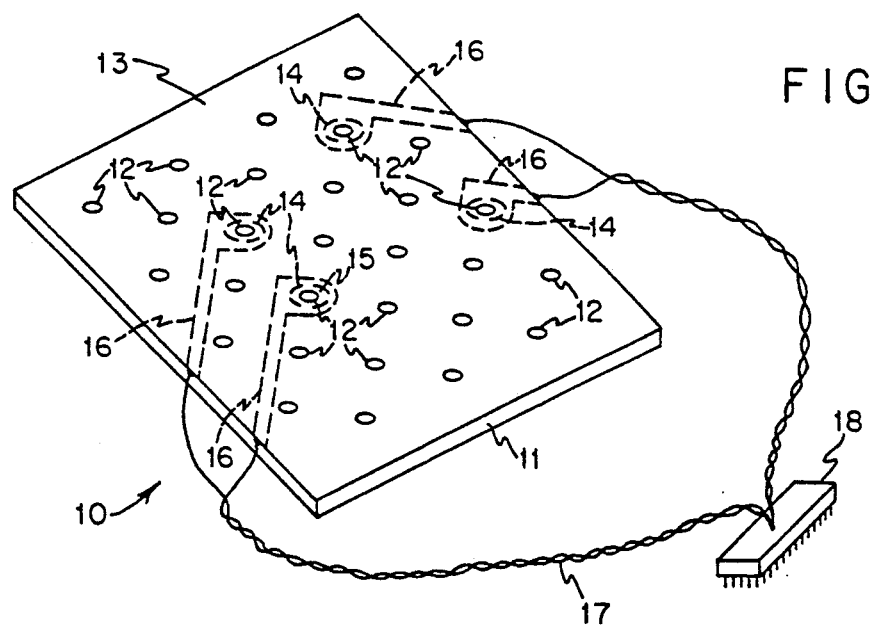
FIG. 2 is an isometric view (not to scale) illustrating the overall configuration of the present invention.

FIG. 2 is another view of removable probe template 10. This view is not to scale but rather is meant to show the overall relationship between the components. In particular, it is seen that insulative substrate 11 has disposed thereon land patterns with first portions 15 surrounding select substrate apertures 12. Second conductive land portions 16 extend from first portions 15 to the edges of substrate 11 where wires 17 are connected to the lands and ultimately are connected to pin plug 18 which is insertable into suitable test and/or control instrumentation. Wires 17 are typically 30 gauge copper wires soldered to conductive land portions 16 at the edges of substrate 11. Wires 17 are preferably twisted together for noise suppression. However, noise suppression is not necessary for all pin choices. Insulative substrate 11 is typically approximately 0.01 inches thick and may comprise a material such as an electrically inert cellulose paper commonly known as fish paper. Fiberglass and Mylar TM or other nonconductive material may also be used. Substrate 11 is also preferably flexible so that insertion of module 50 into a recessed portion of Clark board 60 becomes possible without fracturing the template or breaking the connection.

Conductive land portions 16 are seen to extend between apertures or pin holes 12 so as to be disposed as far away from them as possible so that the close spacing employed does not produce inadvertent contact. Additionally, it is also desirable to provide thin insulative layer 13 (best seen in FIG. 4) which is disposed over substrate 11 and conductive land portions 15 and 16. Insulative layer 13 may comprise a layer of varnish or may preferably comprise a layer of clear insulative tape. It should also be noted that insulative layer 13 does not have to extend over an entire side of the template. Insulative layer 13 may be applied partially only over conductive land patterns. Apertures 12 correspond to the TCM pin pattern and are provided in insulative layer 13 and also in substrate 11. Additionally, for those select pins to which it is desirable to make contact, insulative layer 13 possesses openings 14 therethrough which are slightly larger than pin hole apertures 12. In fact, these larger apertures in insulative layer 13 are preferably slightly larger than shoulder portions on pins 51 (see FIG. 4 discussed below). This provides a mechanism for the shoulder portion of pins 51 on module 50 to make contact with first land portion 15 surrounding select apertures. Selected pins may include signal pins or power pins. With power pin selection, twisting of wires 17 for shielding is not necessary. Conductive land portions 15 and 16 may comprise copper tape or an etched copper material. If copper tape is employed, first and second portions (15 and 16) of the land are preferably cut from a single piece of copper tape. The width of the second portion of the land 16 is preferably smaller than the width between module pins so as to avoid making electrical contact with other pins. Also, in terms of noise suppression, wires that lead to a signal pin are preferably twisted together with a wire which is connected to a voltage reference pin and/or to a ground pin although this is not an essential requirement. Conductive paths to many different pins can be laid on the same template pad. With the use of copper tape, approximately 30 pins may be effectively monitored and/or controlled. If however, more refined printed circuit etching methodologies are employed, approximately 100 pins may be monitored using land patterns disposed on only a single side of the board. For situations in which both sides of insulative substrate 11 are employed for the disposition of conductive lands, approximately double the number of pins may be successfully monitored and/or controlled.

Figure 3:
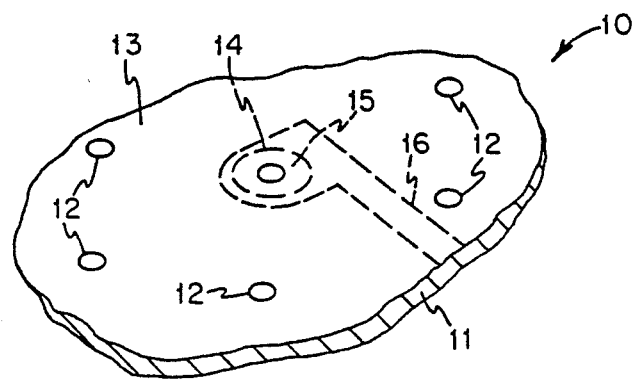
FIG. 3 is a view similar to FIG. 2 except more particularly illustrating the area surrounding a select single aperture in the template.

FIG. 3 illustrates a close-up view of a single pin contact point on one of the conductive land patterns. In particular, aperture 14 in insulative layer 13 is more clearly visible. It is through this aperture that contact is made with the shoulder of a pin on the module. First land portion 15 is seen through aperture 14 in insulative layer 13, disposed about aperture 12 in substrate 11. Narrower land portion 16 is seen extending from first land portion 15 to an edge of substrate 11. A pin 51 with shoulder portion (52 in FIGS. 4 and 5) extends through each of apertures 12 but only a select pin is made to contact first portion 15 of a conductive land pattern. This contact thus renders the pin accessible even though it is inserted into Clark board 60. Continuity of circuit is thus established from pin plug 18, to wires 17, to second land portions 16, to first land portions 15, to pin shoulders 52 and finally to pin 51.

Figure 4:
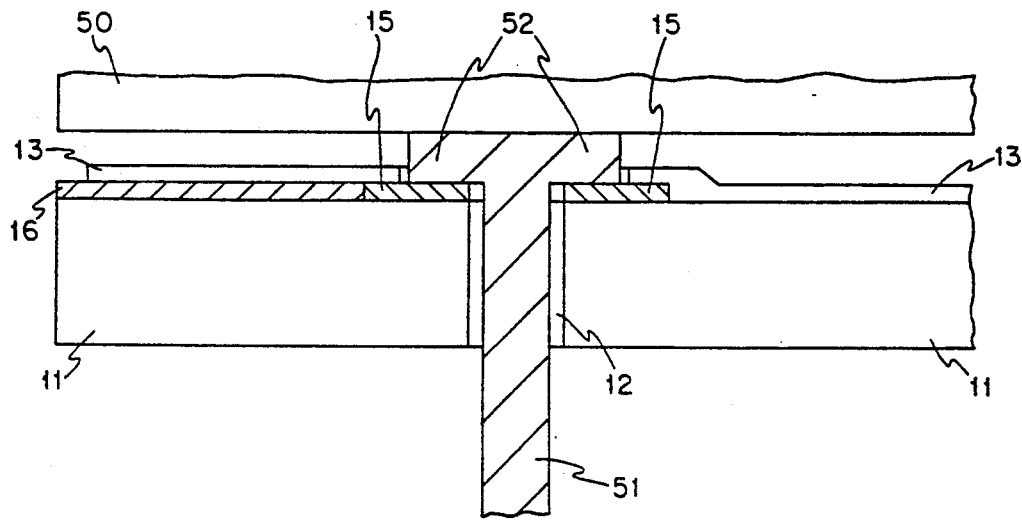
FIG. 4 is a cross sectional side elevation view illustrating contact between the shoulder of a circuit package pin and a first conductive land portion on the substrate.

FIG. 4 provides a cross sectional view of the situation shown in FIG. 3 except that FIG. 4 is more particularly illustrative (for convenience only) of an aperture 12 which is located near the edge of template 11. In particular, the electrical contact between the shoulder 52 of pin 51 is seen to be present with respect to first land portion 15 which surrounds aperture 12. The insulative layer 13 occupies a space between the second conductive land portion 16 and the module 50. The shoulder 52 has a thickness which is equal to the distance between the second conductive land portion and the module 50 when the shoulder 52 is in contact with the first conductive land portion 15. The thickness of the insulative layer 3 is less than the thickness of the shoulder 52.

Figure 5:
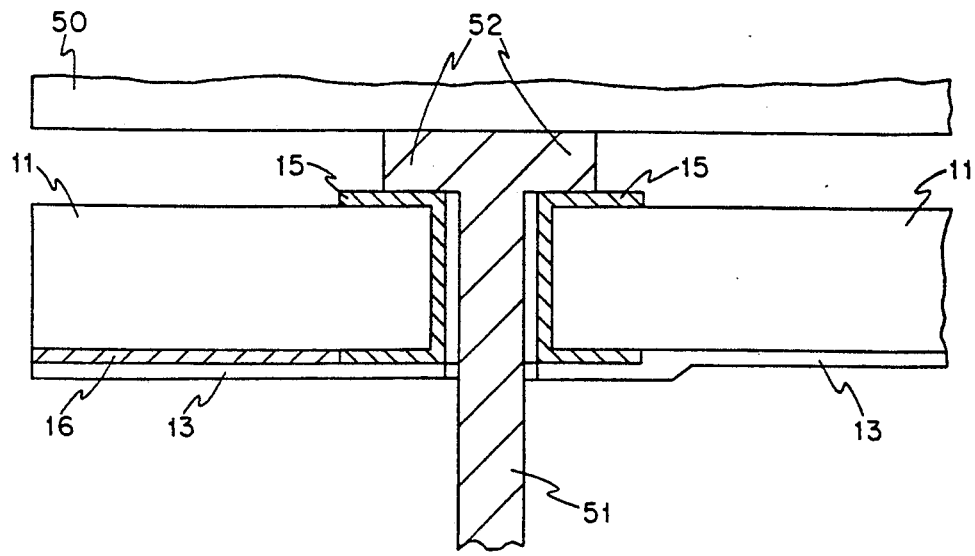
FIG. 5 is a cross sectional side elevation view similar to FIG. 4 but more particularly illustrating a contact arrangement for plated-through hole configurations.

FIG. 5 is a view similar to FIG. 4 but more particularly illustrates the configuration which is desirable when plated-through hole land patterns are employed. In this situation, it is desirable to employ conductive land patterns which are disposed on a side of substrate 11 which is furthest from module 50.

In practice, to install template 10, the power is temporarily removed from the TCM boundary and the TCM is removed. The pad is mounted over the TCM pins, with the copper pads (first land portions) on the side of the template facing the module. The template is pressed firmly onto the TCM and the TCM is remounted and the boundary is again supplied with electrical power. Since substrate 11 is approximately the same thickness as the normal gap between a TCM and the Clark board (which is also referred to as the HARCON (High density ARray CONnector carrier plate), the removable template is easily positioned. The template's land is squeezed against the TCMs pin shoulder on the substrate thus assuring good electrical contact. The TCM's have spring loaded holders that squeeze them to the board. They are commonly called "Moon boots". Probing is accomplished via the attached probe wires (FIG. 2) which are thus connected to the pins of interest. The template of the present invention may be built by hand or constructed using printed circuit board manufacturing processes. Furthermore, it is seen that this invention is not limited to TCMs but can be used on any multichip, module package.

From the above, it should be appreciated that the template of the present invention provides an easy, effective and economical method for accessing multichip module pins in electrical circuit devices. In particular, it is seen that the template of the present invention provides a method and mechanism for circuit test, particularly for those circuits employed in large mainframe computer systems.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A test template for monitoring or controlling electrical characteristics of electronic circuits connected to the pins of a multi-pin chip circuit package or an assembly thereof, said template comprising:
   an insulative substrate having apertures therein corresponding to pin patterns on said circuit package;
   a pattern of conductive lands disposed on said insulative substrate, each of said lands including a first portion disposed in the vicinity of at least some of said apertures, and also including a second portion electrically connected to said first portion, with said second portion extending between said apertures to an edge of said substrate;
   an insulative layer disposed at least partially over said conductive lands, said insulative layer having apertures therein corresponding to said pin patterns, said insulative layer being sufficiently thin so as to permit shoulder portions of said pins to make electrical contact with said first land portions; and
   conductor means electrically connected to said second portions of said conductive lands near at least one substrate edge, whereby electrical characteristics associated with interior ones of said pins of said circuit package are capable of being monitored or controlled.

2. The template of claim 1 in which said first land portions are electrically connected through said apertures in said substrate so as to connect to lands on the opposite side of said substrate, in the vicinity of said substrate apertures.

3. The apparatus of claim 1 in which said insulative substrate is flexible.

4. An easily testable electrical circuit apparatus comprising:
   a flat, insulative substrate having apertures therein corresponding to pin patterns on a multi-pin electrical circuit package;
   a pattern of flat, conductive lands disposed on said insulative substrate, each of said lands including a first portion disposed in the vicinity of at least some of said apertures, and also including a second portion electrically connected to said first portion with said second portion extending between said apertures to an edge of said substrate;
   an insulative layer disposed over said conductive lands, said insulative layer also having apertures therein corresponding to said pin patterns, said insulative layer apertures providing exposure to said first conductive land portions in the vicinity of said substrate apertures;
   conductor means electrically connected to said second portions of said conductive lands near to at least one substrate edge; and
   said multi-pin electrical circuit package having its pins disposed through said substrate apertures and said layer apertures, said pins having shoulder portions in electrical contact with said first land portions exposed through said apertures in said insulative layer which is sufficiently thin so as to permit said shoulder portions of said pins to make electrical contact with said first land portions.

5. The apparatus of claim 4 further including circuit board means for insertion of said pins, said substrate being disposed between said circuit package and said board.

6. The method for electrically accessing pins on a multi-pin chip circuit package or an assembly thereof which is plugged into a circuit board, said method comprising the step of: disposing, between said board and said circuit package or assembly, a template comprising an insulative substrate having apertures therein corresponding to pin patterns on said circuit package; a pattern of conductive lands disposed on said insulative substrate, each of said lands including a first portion disposed in the vicinity of at least some of said apertures and also including a second portion extending between said apertures to an edge of said substrate; an insulative layer disposed at least partially over said conductive lands, said insulative layer having apertures therein corresponding to said pin patterns, said insulative layer also being sufficiently thin so as to permit shoulder portions of said pins to make electrical contact with said first land portions; and conductor means electrically connected to said second portions of said conductive lands near at least one substrate edge, whereby electrical characteristics associated with interior ones of said pins of said circuit package are capable of being monitored or controlled.

* * * * *